United States Patent
Darolia et al.

(10) Patent No.: US 6,720,038 B2
(45) Date of Patent: Apr. 13, 2004

(54) METHOD OF FORMING A COATING RESISTANT TO DEPOSITS AND COATING FORMED THEREBY

(75) Inventors: Ramgopal Darolia, West Chester, OH (US); Bangalore Aswatha Nagaraj, West Chester, OH (US)

(73) Assignee: General Electric Company, Schenectady, NY (US)

( * ) Notice: Subject to any disclaimer, the term of this patent is extended or adjusted under 35 U.S.C. 154(b) by 22 days.

(21) Appl. No.: 10/073,564

(22) Filed: Feb. 11, 2002

(65) Prior Publication Data

US 2003/0152797 A1 Aug. 14, 2003

(51) Int. Cl.$^7$ ............................................... C23L 14/30
(52) U.S. Cl. ............ 427/596; 427/255.32; 427/255.34; 427/255.36; 427/255.7; 427/350; 427/372.2
(58) Field of Search ........................ 427/596, 255.32, 427/255.7, 255.34, 255.36, 350, 372.2

(56) References Cited

U.S. PATENT DOCUMENTS

| | | | | |
|---|---|---|---|---|
| 4,399,199 A | * | 8/1983 | McGill et al. .............. | 428/633 |
| 5,512,382 A | * | 4/1996 | Strangman .................. | 428/632 |
| 5,660,885 A | | 8/1997 | Hasz et al. ............... | 427/374.5 |
| 5,683,825 A | * | 11/1997 | Bruce et al. ................. | 428/698 |
| 5,792,521 A | | 8/1998 | Wortman .................... | 427/567 |
| 5,871,820 A | | 2/1999 | Hasz et al. ............... | 427/419.2 |
| 5,914,189 A | | 6/1999 | Hasz et al. ................. | 428/335 |
| 6,482,537 B1 | * | 11/2002 | Strangman et al. ......... | 428/633 |

* cited by examiner

*Primary Examiner*—Timothy Meeks
(74) *Attorney, Agent, or Firm*—David L. Narciso; Gary M. Hartman; Domenica N. S. Hartman

(57) ABSTRACT

A thermal barrier coating (TBC) system and method for forming the coating system on a component. The method generally entails forming a TBC on the surface of the component so that the TBC has at least an outer portion that is resistant to infiltration by CMAS. The TBC is formed by co-depositing first and second ceramic compositions by physical vapor deposition so that the entire TBC has columnar grains and at least the outer portion of the TBC is a mixture of the first and second ceramic compositions. The outer portion is preferably a continuation of the inner portion, such that the TBC is not characterized by discrete inner and outer coatings. The second ceramic composition serves to increase the resistance of the outer portion of the TBC to infiltration by molten CMAS. A platinum-group metal may be co-deposited with the first and second ceramic compositions, or deposited before the TBC and then diffused into the outer portion as a result of the parameters employed in the deposition process.

22 Claims, 4 Drawing Sheets

METHOD OF FORMING A COATING RESISTANT TO DEPOSITS AND COATING FORMED THEREBY

CROSS REFERENCE TO RELATED APPLICATIONS

Not applicable

STATEMENT REGARDING FEDERALLY SPONSORED RESEARCH

Not applicable

BACKGROUND OF THE INVENTION (1) Field of the Invention

This invention generally relates to coatings for components exposed to high temperatures, such as the hostile thermal environment of a gas turbine engine. More particularly, this invention is directed to a method of forming a thermal barrier coating, in which the resulting coating is resistant to infiltration by contaminants present in a high temperature operating environment.

(2) Description of the Related Art

Hot section components of gas turbine engines are often protected by a thermal barrier coating (TBC), which reduces the temperature of the underlying component substrate and thereby prolongs the service life of the component. Ceramic materials and particularly yttria-stabilized zirconia (YSZ) are widely used as TBC materials because of their high temperature capability, low thermal conductivity, and relative ease of deposition by plasma spraying, flame spraying and physical vapor deposition (PVD) techniques. Air plasma spraying (APS) has the advantages of relatively low equipment costs and ease of application and masking, while TBC's employed in the highest temperature regions of gas turbine engines are often deposited by PVD, particularly electron-beam PVD (EBPVD), which yields a strain-tolerant columnar grain structure. Similar columnar microstructures can be produced using other atomic and molecular vapor processes.

To be effective, a TBC must strongly adhere to the component and remain adherent throughout many heating and cooling cycles. The latter requirement is particularly demanding due to the different coefficients of thermal expansion (CTE) between ceramic materials and the substrates they protect, which are typically superalloys, though ceramic matrix composite (CMC) materials are also used. An oxidation-resistant bond coat is often employed to promote adhesion and extend the service life of a TBC, as well as protect the underlying substrate from damage by oxidation and hot corrosion attack. Bond coats used on superalloy substrates are typically in the form of an overlay coating such as MCrAlX (where M is iron, cobalt and/or nickel, and X is yttrium or another rare earth element), or a diffusion aluminide coating. During the deposition of the ceramic TBC and subsequent exposures to high temperatures, such as during engine operation, these bond coats form a tightly adherent alumina ($Al_2O_3$) layer or scale that adheres the TBC to the bond coat.

The service life of a TBC system is typically limited by a spallation event brought on by thermal fatigue. In addition to the CTE mismatch between a ceramic TBC and a metallic substrate, spallation can occur as a result of the TBC structure becoming densified with deposits that form on the TBC during gas turbine engine operation. Notable constituents of these deposits include such oxides as calcia, magnesia, alumina and silica, which when present together at elevated temperatures form a compound referred to herein as CMAS. CMAS has a relatively low melting eutectic (about 1190° C.) that when molten is able to infiltrate the hotter regions of a TBC, where it resolidifies during cooling. During thermal cycling, the CTE mismatch between CMAS and the TBC promotes spallation, particularly TBC deposited by PVD and APS due to the ability of the molten CMAS to penetrate their columnar and porous grain structures, respectively. This process of CMAS infiltration and resulting stresses during heating and cooling cycles is illustrated in FIG. 1.

Various studies have been performed to find coating materials that are resistant to infiltration by CMAS. Notable examples are U.S. Pat. Nos. 5,660,885, 5,871,820 and 5,914,189 to Hasz et al., which disclose three types of coatings to protect a TBC from CMAS-related damage. The protective coatings are classified as being impermeable, sacrificial or non-wetting to CMAS. Impermeable coatings are defined as inhibiting infiltration of molten CMAS, and include silica, tantala, scandia, alumina, hafnia, zirconia, calcium zirconate, spinels, carbides, nitrides, suicides, and noble metals such as platinum. Sacrificial coatings are said to react with CMAS to increase the melting temperature or the viscosity of CMAS, thereby inhibiting infiltration. Suitable sacrificial coating materials include silica, scandia, alumina, calcium zirconate, spinels, magnesia, calcia and chromia. As its name implies, a non-wetting coating is non-wetting to molten CMAS, with suitable materials including silica, hafnia, zirconia, beryllium oxide, lanthana, carbides, nitrides, suicides, and noble metals such as platinum. According to the Hasz et al. patents, an impermeable coating or a sacrificial coating is deposited directly on the TBC, and may be followed by a layer of impermeable coating (if a sacrificial coating was deposited first), sacrificial coating (if the impermeable coating was deposited first), or non-wetting coating. If used, the non-wetting coating is the outermost coating of the protective coating system. Whether used alone or in combination, the impermeable, sacrificial and non-wetting coatings are deposited as discrete layers on top of the TBC.

While the coating systems disclosed by Hasz et al. are effective in protecting a TBC from damage resulting from CMAS infiltration, further improvements would be desirable. In particular, infiltration of columnar TBC deposited by physical vapor deposition is not directly addressed by Hasz et al., yet is of considerable interest to the aerospace industry.

BRIEF SUMMARY OF THE INVENTION

The present invention generally provides a thermal barrier coating (TBC) system and method for forming the coating system on a component suitable for use in a high-temperature environment, such as the hot section of a gas turbine engine. The invention is particularly directed to a method of forming a columnar TBC system to be resistant to infiltration by CMAS and other potential high-temperature contaminants.

The method of this invention generally entails forming a TBC on the surface of a component so that the TBC has at least an outer portion that is resistant to infiltration by CMAS. The thermal barrier coating is formed by evaporating at least one ceramic source material within a coating chamber of a physical vapor deposition apparatus. A first ceramic composition and a second ceramic composition are then co-deposited by physical vapor deposition so that the entire thermal barrier coating has columnar grains and at least the outer portion of the thermal barrier coating is a mixture of the first and second ceramic compositions. An inner portion of the TBC may be deposited to contain only the first ceramic composition, after which the outer portion of the TBC is deposited to contain the mixture of the first and second ceramic compositions. The outer portion is preferably a continuation of the inner portion, i.e., a change in composition may occur within the TBC between the inner and outer portions, but the TBC is otherwise continuous and not characterized by discrete inner and outer coatings. The second ceramic composition serves to increase the resistance of the outer portion of the thermal barrier coating to infiltration by molten CMAS. More particularly, the second ceramic composition is preferably capable of interacting with molten CMAS, forming a compound with a melting temperature that is significantly higher than CMAS. As a result, the reaction product of CMAS and the second ceramic composition resolidifies before it can fully infiltrate the TBC. The outer portion may also contain at least one platinum-group metal that further inhibits infiltration by molten CMAS. The platinum-group metal maybe co-deposited with the first and second ceramic compositions, or deposited before the thermal barrier coating and then diffused into the outer portion as a result of the parameters employed in the deposition process.

The TBC system of this invention has an increased temperature capability as a result of the TBC having reduced vulnerability to spallation from contamination by CMAS and other potential contaminants. The TBC is not required to be made up of multiple discrete layers as proposed in the past, but instead preferably has a continuous structure with its outer portion enriched with the second ceramic composition and optionally a platinum-group metal. Such a continuous TBC structure can be obtained by first depositing the inner portion to contain the first ceramic composition, and then initiating deposition of the second ceramic composition while continuing to deposit the first ceramic composition, such that the TBC is deposited in a single deposition cycle. According to a preferred aspect of the invention, the same coating cycle is used to deposit the TBC, the platinum-group metal and a metallic bond coat on which the platinum-group metal is deposited, such that the entire coating process is performed in a single operation with a single coating apparatus. In this manner, the additional cost of incorporating the second ceramic composition and the platinum-group metal can be minimized.

Other objects and advantages of this invention will be better appreciated from the following detailed description.

DETAILED DESCRIPTION OF THE INVENTION

Figure 1:
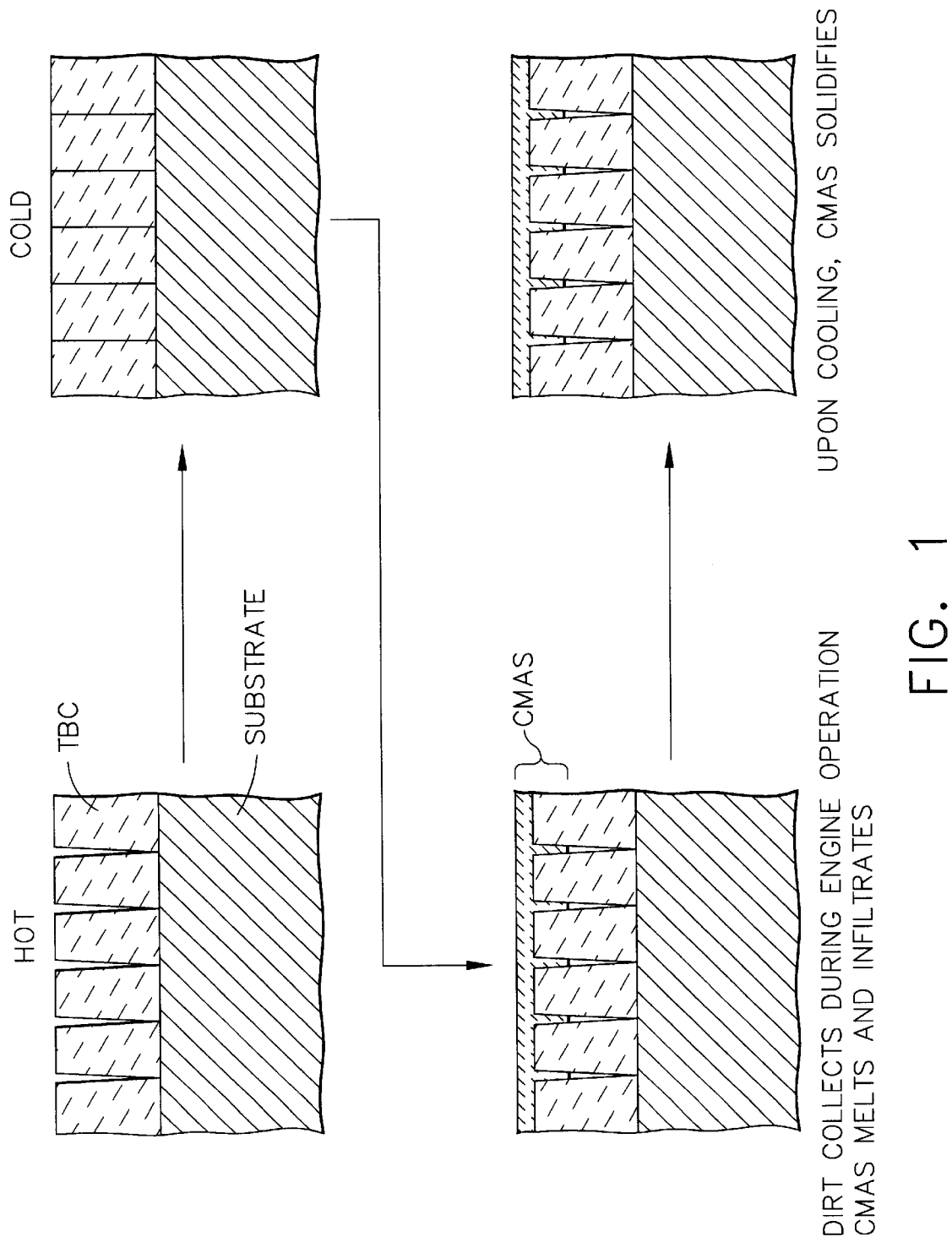
FIG. 1 illustrates the process of CMAS infiltration and resulting stresses that occur during heating and cooling cycles of a thermal barrier coating having a columnar grain structure.
Figure 2:
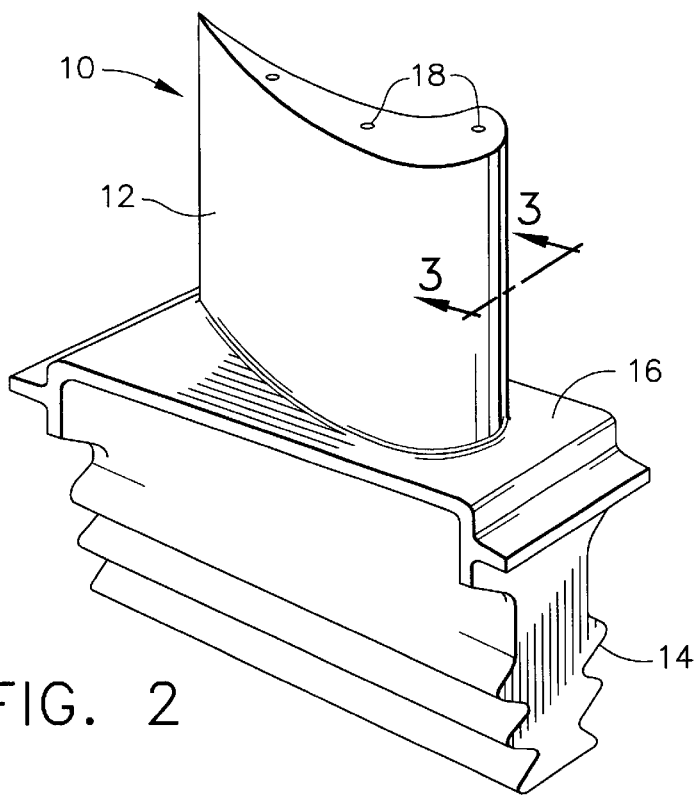
FIG. 2 is a perspective view of a high pressure turbine blade.

The present invention will be described in reference to a high pressure turbine blade 10 shown in FIG. 2, though the invention is generally applicable to any component that operates within a thermally and chemically hostile environment. The blade 10 generally includes an airfoil 12 against which hot combustion gases are directed during operation of the gas turbine engine, and whose surfaces are therefore subjected to severe attack by oxidation, hot corrosion and erosion. The airfoil 12 is anchored to a turbine disk (not shown) with a dovetail 14 formed on a root section 16 of the blade 10. Cooling holes 18 are present in the airfoil 12 through which bleed air is forced to transfer heat from the blade 10.

Figure 3:
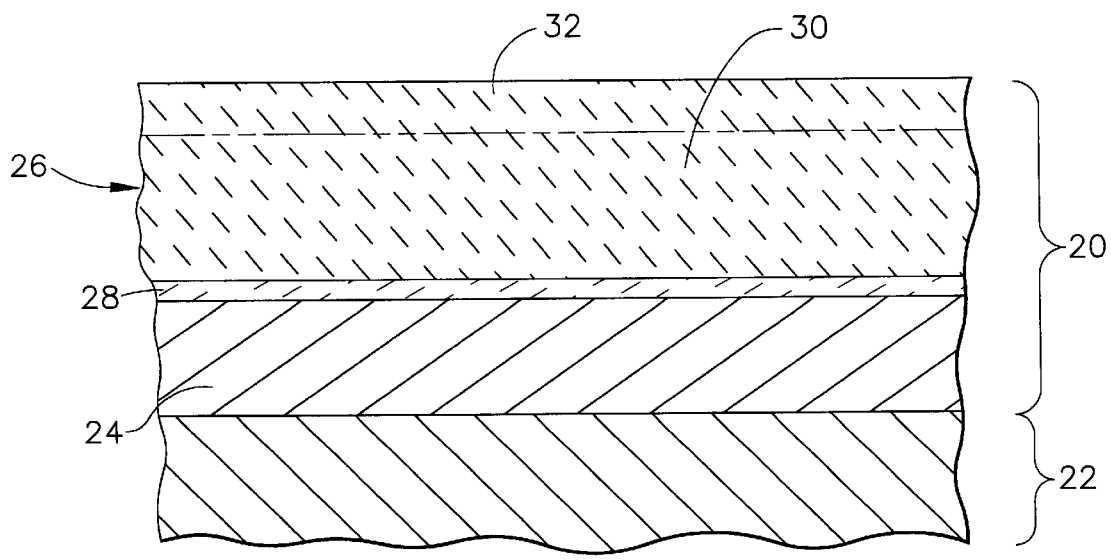
FIG. 3 is a cross-sectional view of the blade of FIG. 2 along line 3—3, and shows a thermal barrier coating system in accordance with this invention.

The surface of the airfoil 12 is protected by a TBC system 20, represented in FIG. 3 as including a metallic bond coat 24 that overlies the surface of a substrate 22, the latter of which may be a superalloy and typically the base material of the blade 10. As widely practiced with TBC systems for components of gas turbine engines, the bond coat 24 is preferably an aluminum-rich composition, such as an overlay coating of an MCrAlX alloy or a diffusion coating such as a diffusion aluminide or a diffusion platinum aluminide, all of which are known in the art. Alternatively, overlay coatings of beta-phase nickel aluminide ($\beta$NiAl) intermetallic can be used as the bond coat 24, in accordance with commonly-assigned U.S. Pat. No. 5,975,852 to Nagaraj et al., U.S. Pat. No. 6,153,313 to Rigney et al., U.S. Pat. No. 6,255,001 to Darolia, and U.S. Pat. No. 6,291,084 to Darolia et al. Such aluminum-rich bond coats develop an aluminum oxide (alumina) scale 28, which is grown by oxidation of the bond coat 24. The alumina scale 28 chemically bonds a thermal-insulating TBC 26 to the bond coat 24 and substrate 22. As with prior art TBC's, the TBC 26 of this invention is intended to be deposited to a thickness that is sufficient to provide the required thermal protection for the underlying substrate 22 and blade 10. A suitable thickness is generally on the order of about 75 to about 300 micrometers.

Of particular interest to the present invention is the susceptibility of TBC materials to attack by CMAS. As discussed previously, CMAS is a relatively low melting eutectic that when molten is able to infiltrate columnar and porous TBC materials, and subsequently resolidify to promote spallation during thermal cycling. To reduce its vulnerability to spallation from contamination by CMAS and other potential contaminants, the TBC 26 is formed of a base ceramic material co-deposited with at least one additional ceramic material capable of interacting with CMAS. The TBC 26 shown in FIG. 3 is shown as comprising two zones—an inner portion 30 nearer the bond coat 24 and an outer portion 32 overlying the inner portion 30. As will be discussed in greater detail below, the inner and outer portions 30 and 32 of the TBC 26 are not discrete layers, but instead may differ in their compositions. According to a preferred aspect of the invention, both the inner and outer portions 30 and 32 are formed of the same base ceramic material, with at least the outer portion containing the additional ceramic material(s) and optionally a platinum-group metal that render the TBC 26 more resistant to infiltration by CMAS and other potential high-temperature contaminants. In terms of processing, high temperature capability and low thermal conductivity, a preferred base ceramic material for the TBC 26 is an yttria-stabilized zirconia (YSZ), a preferred composition being about 3 to about 8 weight percent yttria, though other ceramic materials could be used, such as nonstabilized zirconia, or zirconia partially or fully stabilized by magnesia, ceria, scandia or other oxides. The additional ceramic material(s) present in at least the outer portion 32 of the TBC 26 are preferably capable of interacting with molten CMAS to form a compound with a melting temperature that is significantly higher than CMAS, so that the reaction product of CMAS and the additional ceramic material does not melt and does not infiltrate the TBC 26. While those materials identified by Hasz et al. as "sacrificial layer" materials are potential candidates for the additional ceramic material of this invention, alumina has been investigated and shown to be effective as the additional ceramic material for this invention. When the alumina content of the outer portion 32 of the TBC 26 interacts with molten CMAS, one or more refractory phases form with higher melting temperatures than CMAS. In effect, the alumina content of CMAS is increased above the eutectic point, yielding a modified CMAS with a higher melting and/or crystallization temperature.

Figure 4:
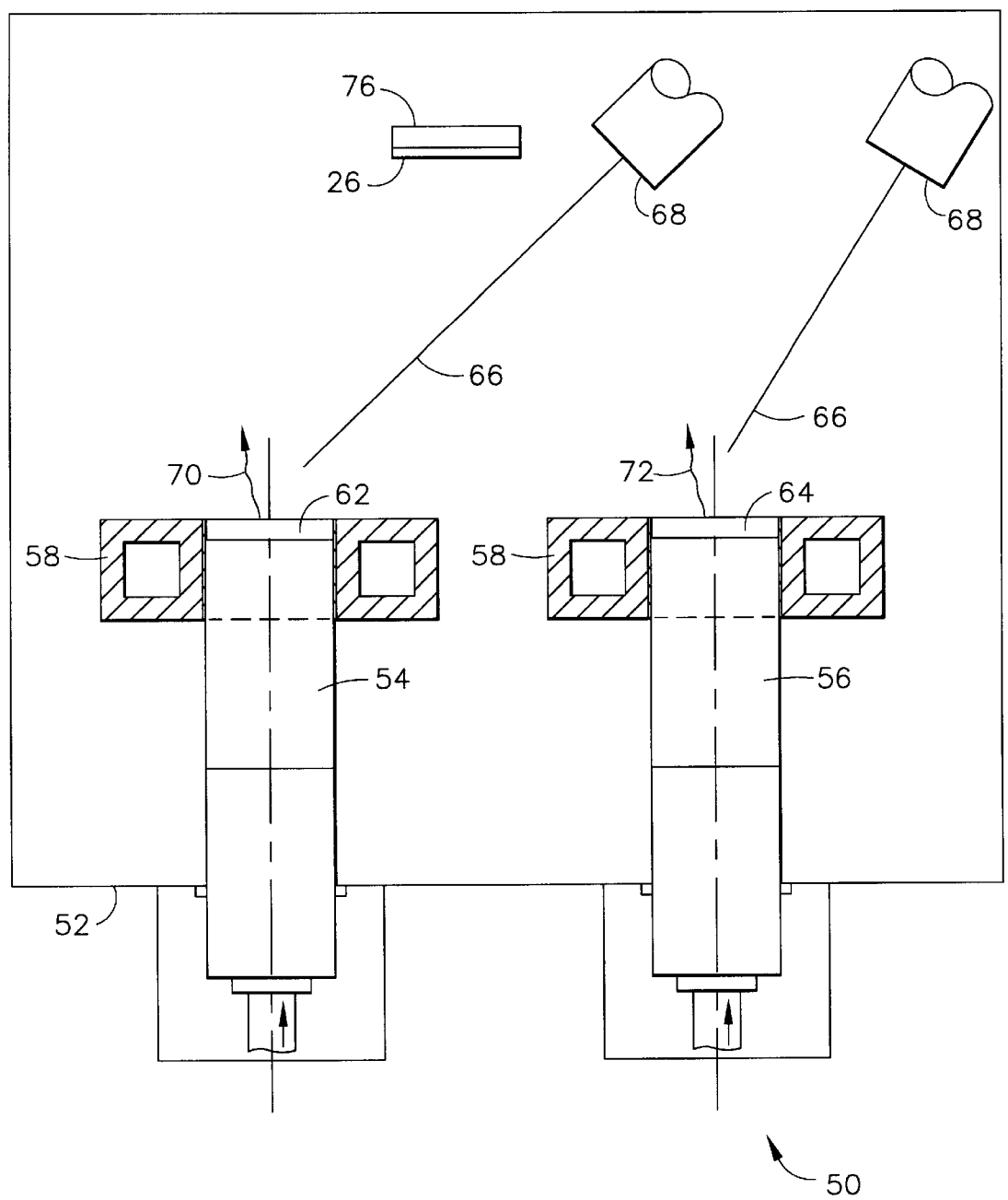
FIG. 4 schematically represents an electron beam physical vapor deposition apparatus of a type for use in depositing the thermal barrier coating system of FIG. 3.

According to another preferred aspect of this invention, the TBC 26 of FIG. 3 is represented as having a strain-tolerant microstructure of columnar grains. As known in the art, such columnar microstructures can be achieved by depositing the TBC 26 using a physical vapor deposition (PVD) technique, such as EBPVD, though other PVD techniques could be used such as laser beam PVD, sputtering (e.g., magnetron), ion plasma, and cathodic arc deposition. EBPVD processes generally require the presence of an evaporation source of the desired coating composition, and an electron beam at an appropriate power level to create a vapor of the evaporation source in the presence of the surface to be coated. In the present invention, a single evaporation source and more preferably multiple evaporation sources are used to deposit the base ceramic material for the TBC 26 and the additional ceramic material(s) for the outer portion 32 of the TBC 26. FIG. 4 schematically represents an EBPVD coating apparatus 50, including a coating chamber 52 in which a component 76 is suspended for coating. The TBC 26 of this invention is represented as being deposited on the component 76 by melting and vaporizing two ingots 54 and 56 of the desired ceramic materials with a pair of electron beams 66 produced by electron beam guns 68. The intensities of the beams 66 are sufficient to produce vapor clouds 70 and 72 that mix within the coating chamber 52, and then contact and condense on the component 76 to form the TBC 26. As shown, the vapor clouds 70 and 72 evaporate from separate pools 62 and 64, respectively, of the molten coating materials contained within reservoirs formed by crucibles 58 that surround the upper ends of the ingots 54 and 56. As they are gradually consumed by the deposition process, the ingots 54 and 56 are incrementally fed into the chamber 52.

In depositing the TBC 26 to have inner and outer portions 30 and 32 with different compositions, the inner portion 30 is first deposited by evaporating only the ingot (e.g., 54 in FIG. 4) of the base ceramic material (e.g., YSZ). Once a desired thickness for the inner portion 30 is obtained, evaporation commences of the second ingot (e.g., 56 in FIG. 4) containing the desired additional ceramic material (e.g., alumina), so that the outer portion 32 of the TBC 26 contains a mixture of the base and additional ceramic materials. A suitable thickness for the inner portion 30 of the TBC 26 is on the order of about 50 to about 500 micrometers, more preferably about 75 to about 100 micrometers. A suitable thickness for the outer portion 32 of the TBC 26 is about 10 to about 50 micrometers, more preferably about 10 to about 25 micrometers, and a suitable composition for the outer portion 32 is about 2 to about 90 weight percent alumina, more preferably about 50 to about 75 weight percent alumina, the balance YSZ. Alternatively, the TBC 26 can be deposited to have a uniform composition throughout its inner and outer portions 30 and 32 by evaporating both ingots 54 and 56 simultaneously, or combining the base ceramic material (e.g., YSZ) and the additional ceramic material (e.g., alumina) in a single ingot, so that the entire TBC 26 contains a mixture of the base and additional ceramic materials.

The optional platinum-group metal may be platinum, ruthenium, rhodium, palladium, osmium and iridium, with platinum being preferred. The platinum-group metal is preferably present in at least the outer portion 32 of the TBC 26 in an amount of about 5 to about 50 weight percent. It is permissible that the outer portion 32 consist essentially of the platinum-group metal and alumina, e.g., about 10 to about 50 weight percent platinum-group metal and the balance alumina. In the ranges stated, the platinum-group metal is believed to serve as a barrier to infiltration of CMAS into the TBC 26. According to one aspect of the invention, the platinum-group metal is present throughout the TBC 26 or may be present within only the outer portion 32 of the TBC 26, as a result of being co-deposited with the ceramic materials of the TBC 26. For this purpose, a separate ingot of the platinum-group metal would be provided and evaporated with an electron beam. Alternatively, the platinum-group metal is not introduced into the outer portion 32 of the TBC 26 through deposition directly with the TBC 26, but instead is introduced by diffusion from the bond coat 24. For this purpose, the bond coat 24 is either alloyed to contain the platinum-group metal, or is overcoated with a thin layer of the platinum-group metal. Deposition of the TBC 26 is then carried out in a manner that promotes diffusion of the platinum-group metal though the inner portion 30 of the TBC and into the outer portion 32 of the TBC 26, as will be discussed below. Whether co-deposited with the ceramic materials or deposited separately before deposition of the ceramic materials, the platinum-group metal is preferably deposited in the same coating apparatus used to deposit the TBC 26, e.g., the EBPVD apparatus 50 of FIG. 3, and during the same coating cycle. However, it is foreseeable that the platinum-group metal could be incorporated using other methods, such as being electroplated on the bond coat 24.

If the platinum-group metal is deposited as a layer on the bond coat 24, a suitable thickness for this layer is believed to be about 1 to about 10 micrometers. Alternatively, the desired platinum-group metal can be incorporated into a suitable bond coat material. In a preferred embodiment, the bond coat 24 is a beta-phase nickel aluminide overlay coating alloyed to contain platinum and chromium in accordance with commonly-assigned U.S. patent application Ser. No. 10/029,320, though other bond coat materials containing a platinum-group metal could be used, notably diffusion platinum aluminides. Once a suitable amount of platinum-group metal is present within or on the bond coat 24, deposition of the TBC 26 is immediately commenced. It is believed that diffusion of the platinum-group metal into the outer portion 32 of the TBC 26 can be promoted by maintaining the absolute pressure within the coating chamber 52 at low levels. A suitable absolute pressure is believed to be not higher than $10^{-4}$ torr (about $1.3 \times 10^{-4}$ mbar), preferably in a range of about $10^{-5}$ to $10^{-4}$ torr (about $1.3 \times 10^{-5}$ to about $1.3 \times 10^{-4}$ mbar). Following deposition of the TBC 26, a heat treatment can be performed at a temperature of about 1800 to about 2100° F (about 980° C. to about 1150° C. to further promote diffusion of the platinum-group metal into the outer portion 32 of the TBC 26.

Figure 5:
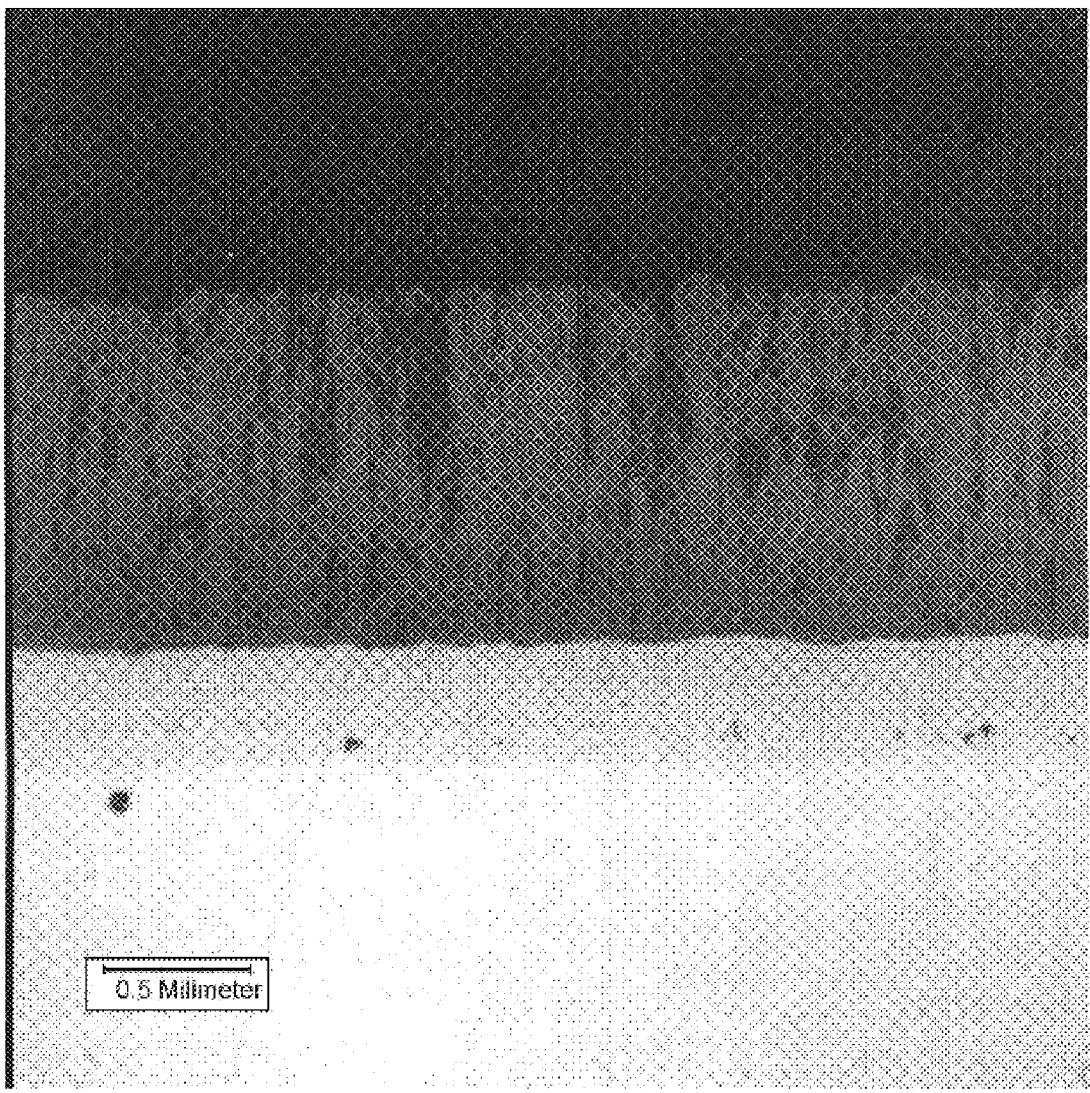
FIG. 5 is a scanned image of a thermal barrier coating system in accordance with this invention.

In an investigation leading to the present invention, testing was performed with four superalloy specimens coated with platinum aluminide bond coats deposited to thicknesses of about sixty micrometers. The specimens were formed of the nickel-base superalloy known as René N5, having a nominal composition, by weight, of about 7.5% Co, 7.0% Cr, 6.5% Ta, 6.2% Al, 5.0% W, 3.0%Re, 1.5% Mo, 0.15% Hf, 0.05% C, 0.004% B, 0.01% Y, the balance nickel and incidental impurities. The specimens were placed in an EBPVD apparatus and a mixed TBC layer containing both 7% YSZ and alumina was deposited. The mixed layer of YSZ and alumina was obtained by simultaneously evaporating separate ingots of YSZ and alumina. The alumina contents for the mixed layers ranged from about 1.8 to about 4.0 weight percent. As evidenced by the microphotograph of FIG. 5, the resulting TBC's were characterized by a substantially continuous columnar microstructure, and not the discrete layers taught by Hasz et al.

The spallation life potentials of the specimens were then evaluated by furnace cycle testing (FCT) at about 2125° F. (about 1160° C.) with one hour cycles. Testing was terminated for a given specimen when approximately 20 percent or more of its TBC had spalled. At the conclusion of the test, the specimens exhibited FCT lives ranging from 300 to 340 cycles, for an average FCT life of about 320 cycles. A baseline average FCT life for specimens lacking the TBC system of this invention but otherwise identical to the specimens tested is about 238 cycles, evidencing an improvement of about 30 percent. From these results, it was concluded that TBC systems within the scope of this invention are capable of exhibiting improved thermal cycle fatigue life. While alumina levels of about two to about four weight percent were evaluated, it is believed that alumina (or another sacrificial material) at levels of at least five weight percent within at least the outer portion of a columnar TBC would be preferred to promote the resistance of the TBC to infiltration by CMAS and other potential high-temperature contaminants.

While the invention has been described in terms of a preferred embodiment, it is apparent that other forms could be adopted by one skilled in the art, such as by substituting other TBC, bond coat and substrate materials, or by utilizing other methods to deposit and process the TBC materials. Accordingly, the scope of the invention is to be limited only by the following claims.

What is claimed is:

1. A method of forming a thermal barrier coating system on a surface of a component, the thermal barrier coating system comprising a thermal barrier coating that has columnar grains and is resistant to infiltration by CMAS, the method comprising the steps of:
    providing at least one ceramic source material within a coating chamber of a physical vapor deposition apparatus;
    introducing the component into the coating chamber;
    depositing at least one platinum-group metal on the component;
    forming the thermal barrier coating by physical vapor deposition to co-deposit a first ceramic composition and a second ceramic composition so that the thermal barrier coating has columnar grains and at least an outer portion of the thermal barrier coating is a mixture of the first and second ceramic compositions, the second ceramic composition increasing the resistance of the outer portion of the thermal barrier coating to infiltration by molten CMAS; and then
    causing the at least one platinum-group metal to diffuse to the outer portion of the thermal barrier coating.

2. A method according to claim 1, wherein the first ceramic composition is yttria-stabilized zirconia.

3. A method according to claim 1, wherein the second ceramic composition is reactive with molten CMAS to form a compound with a melting temperature higher than CMAS.

4. A method according to claim 3, wherein the second ceramic composition is alumina.

5. A method according to claim 1, further comprising the step of depositing a bond coat on the surface of the component prior to forming the thermal barrier coating.

6. A method according to claim 5, wherein the bond coat and the at least one platinum-group metal are codeposited by physical vapor deposition in the coating chamber, and the step of forming the thermal barrier coating commences immediately after codepositing the bond coat and the at least one platinum-group metal.

7. A method according to claim 6, wherein the bond coat is a beta-phase nickel aluminide overlay coating.

8. A method according to claim 1, wherein the at least one platinum-group metal is deposited by physical vapor deposition in the coating chamber, and the step of forming the thermal barrier coating commences immediately after depositing the at least one platinum-group metal.

9. A method according to claim 1, wherein the at least one platinum-group metal diffuses to the outer portion of the thermal barrier coating during the step of forming the thermal barrier coating.

10. A method according to claim 1, wherein the thermal barrier coating is formed by first depositing the first ceramic composition by physical vapor deposition to form an inner portion of the thermal barrier coating in which the second ceramic composition is not present, after which the first and second ceramic compositions are co-deposited so that the outer portion is a continuation of the inner portion.

11. A method of forming a thermal barrier coating system on a surface of a gas turbine engine component, the thermal barrier coating system comprising a thermal barrier coating that defines an external surface of the component that is resistant to infiltration by CMAS, the method comprising the steps of:
    placing the component in a coating chamber of an electron beam physical vapor deposition apparatus;
    evaporating at least a first source material with an electron beam to deposit a bond coat on the component;
    while the component remains in the coating chamber, evaporating a first ceramic source material with an electron beam to deposit an inner portion of the thermal barrier coating on the bond coat, the inner portion having a columnar grain structure and being formed of a first ceramic composition corresponding to the first ceramic source material;
    while the component remains in the coating chamber, evaporating the first ceramic source material and a second ceramic source material with an electron beam to deposit an outermost portion of the thermal barrier coating on the inner portion, the outermost portion having a columnar grain structure that is a continuation of the columnar grain structure of the inner portion so that the thermal barrier coating is continuous and the inner and outermost portions are not discrete layers, the outermost portion having a thickness of at least 10 micrometers and containing a mixture of at least two weight percent of the second ceramic composition and a balance essentially of the first ceramic composition, the second ceramic composition being reactive with molten CMAS to form a compound with a melting temperature higher than CMAS so as to inhibit infiltration of the outermost portion by molten CMAS.

12. A method according to claim 11 wherein the first ceramic composition is yttria-stabilized zirconia.

13. A method according to claim 11, wherein the second ceramic composition is alumina, and at least the outermost portion contains at least five weight percent alumina.

14. A method according to claim 11, wherein the thermal barrier coating consists of the first and second ceramic compositions.

15. A method according to claim 11, further comprising the steps of depositing at least one platinum-group metal prior to evaporating the first ceramic source material, and later causing the at least one platinum-group metal to diffuse to the outermost outer portion of the thermal barrier coating, such that the outermost portion contains a mixture of the first ceramic composition, the second ceramic composition, and the at least one platinum-group metal.

16. A method according to claim 15, wherein the at least one platinum-group metal is caused to diffuse to the outermost portion of the thermal barrier coating by maintaining the coating chamber at a vacuum level of about $10^{-4}$ to $10{-}5$ torr.

17. A method according to claim 15, wherein the at least one platinum-group metal layer consists essentially of platinum.

18. A method according to claim 15, wherein the bond coat is a beta-phase nickel aluminide overlay coating.

19. A method according to claim 18, wherein the bond coat is alloyed to contain the at least one platinum-group metal.

20. A method according to claim 15, wherein the at least one platinum-group metal is co-deposited by physical vapor deposition with the bond coat.

21. A method according to claim 11, wherein the first and second ceramic source materials are evaporated with separate electron beams.

22. A method according to claim 11, wherein the component is an airfoil-component.

* * * * *